(12) United States Patent
Tanabe et al.

(10) Patent No.: US 7,501,666 B2
(45) Date of Patent: Mar. 10, 2009

(54) METHOD FOR FORMING P-TYPE SEMICONDUCTOR REGION, AND SEMICONDUCTOR ELEMENT

(75) Inventors: Keiichiro Tanabe, Itami (JP); Susumu Yoshimoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/659,610

(22) PCT Filed: Aug. 2, 2005

(86) PCT No.: PCT/JP2005/014095

§ 371 (c)(1),
(2), (4) Date: Feb. 5, 2007

(87) PCT Pub. No.: WO2006/013846

PCT Pub. Date: Feb. 9, 2006

(65) Prior Publication Data

US 2007/0296060 A1    Dec. 27, 2007

(30) Foreign Application Priority Data

Aug. 6, 2004    (JP) .................. 2004-231543

(51) Int. Cl.
*H01L 33/00* (2006.01)
(52) U.S. Cl. .............. 257/101; 257/102; 257/103; 257/E33.013; 438/37; 438/45
(58) Field of Classification Search .............. 257/101, 257/E33.013
See application file for complete search history.

(56) References Cited

U.S. PATENT DOCUMENTS 5,883,000 A * 3/1999 Pasch .................. 438/618

(Continued)

FOREIGN PATENT DOCUMENTS

CN    1365500 A    8/2002

(Continued)

OTHER PUBLICATIONS

English translation of the International Preliminary Report (PCT/IB/338).

*Primary Examiner*—Tu-Tu V Ho
(74) *Attorney, Agent, or Firm*—Fish & Richardson P.C.

(57) ABSTRACT

A substrate 103 is set in a film-forming apparatus, such as a metal organic vapor phase epitaxy system 101, and a GaN buffer film 105, an undoped GaN film 107, and a GaN film 109 containing a p-type dopant are successively grown on the substrate 103 to form an epitaxial substrate E1. The semiconductor film 109 also contains hydrogen, which was included in a source gas, in addition to the p-type dopant. Then the epitaxial substrate E1 is placed in a short pulsed laser beam emitter 111. A laser beam $L_{B1}$ is applied to a part or the whole of a surface of the epitaxial substrate E1 to activate the p-type dopant by making use of a multiphoton absorption process. When the substrate is irradiated with the pulsed laser beam $L_{B1}$ which can induce multiphoton absorption, a p-type GaN film 109a is formed. There is thus provided a method of optically activating the p-type dopant in the semiconductor film to form the p-type semiconductor region, without use of thermal annealing.

10 Claims, 16 Drawing Sheets

(A)

(B)

U.S. PATENT DOCUMENTS

| | | |
|---|---|---|
| 6,822,311 B2 | 11/2004 | Ballantine et al. |
| 6,869,865 B2 | 3/2005 | Maegawa et al. |
| 2001/0055871 A1* | 12/2001 | Takeya et al. ............... 438/604 |
| 2003/0201515 A1 | 10/2003 | Ballantine et al. |
| 2004/0061063 A1* | 4/2004 | Sherohman et al. .... 250/370.12 |
| 2004/0087118 A1* | 5/2004 | Maegawa et al. ........... 438/514 |

FOREIGN PATENT DOCUMENTS

| | | |
|---|---|---|
| JP | 4-79215 | 3/1992 |
| JP | 9-266218 | 10/1997 |
| JP | 11-224957 | 8/1999 |
| JP | 2000-306854 | 11/2000 |
| JP | 2001-127002 | 5/2001 |
| JP | 2001-319888 | 11/2001 |
| JP | 2001-338894 | 12/2001 |
| JP | 2004-158627 | 6/2004 |
| WO | WO 01/09899 | 2/2001 |

* cited by examiner

Fig.1
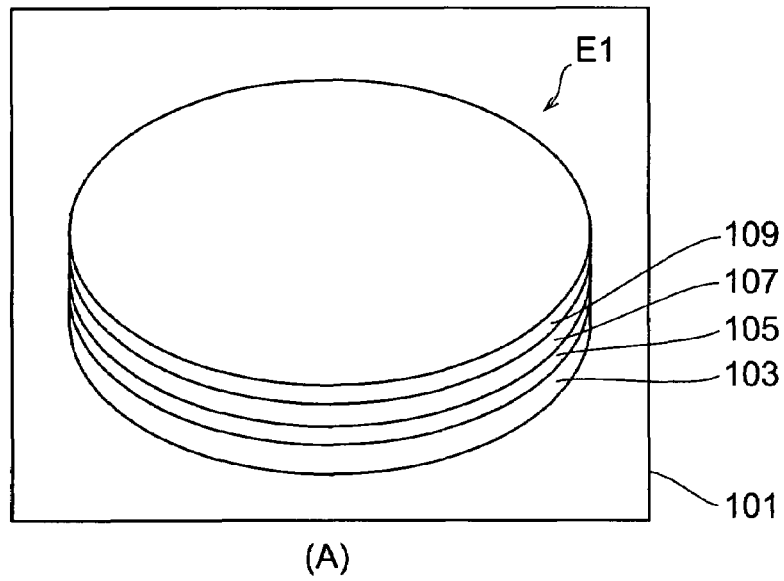
(A)
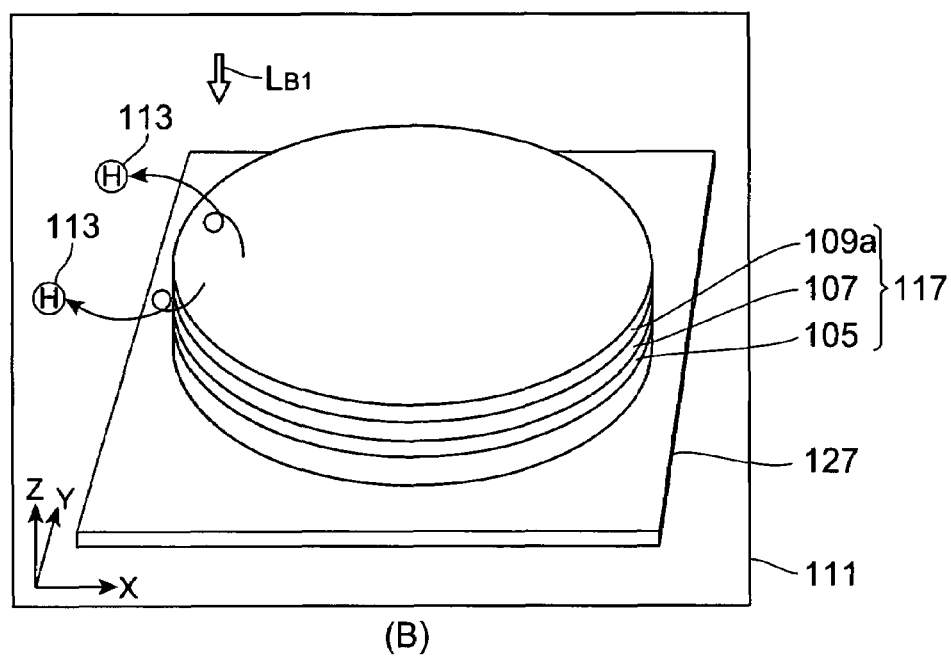
(B)

Fig.4
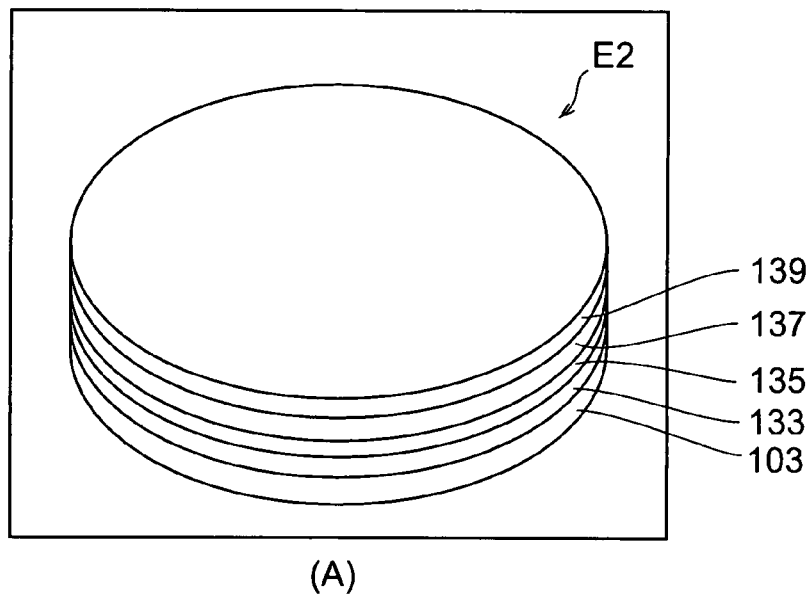
(A)
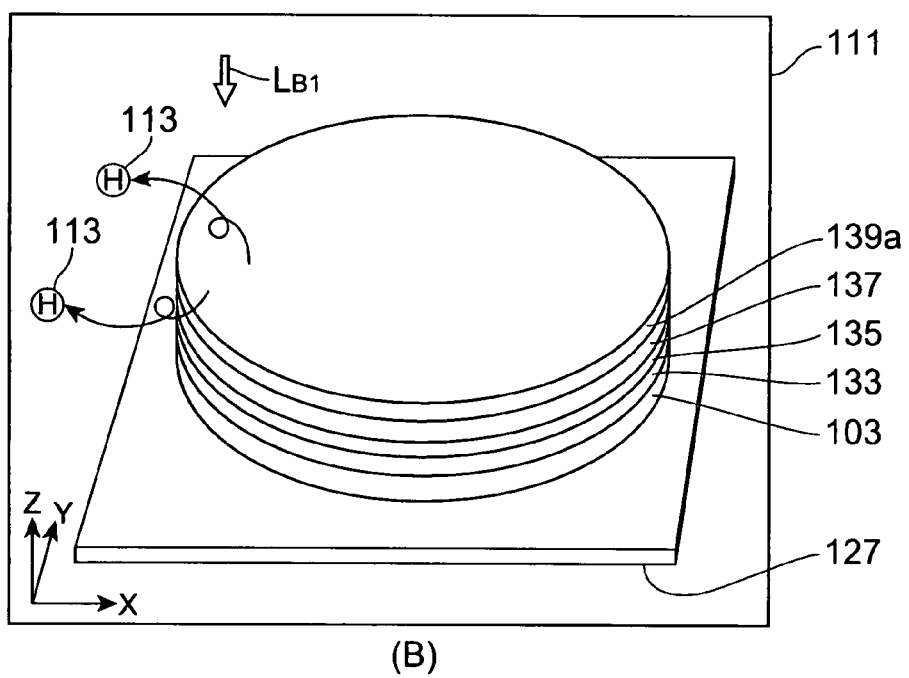
(B)

Fig.6

| TREATMENT | TYPE OF CARRIER | HYDROGEN CONCENTRATION (cm$^{-3}$) | MAGNESIUM CONCENTRATION (cm$^{-3}$) | CARRIER CONCENTRATION (cm$^{-3}$) |
|---|---|---|---|---|
| NO ACTIVATION | — | $5.1 \times 10^{19}$ | $5.5 \times 10^{19}$ | $6 \times 10^{16}$ |
| THERMAL ANNEAL | P | $2.3 \times 10^{19}$ | $5.7 \times 10^{19}$ | $5.1 \times 10^{17}$ |
| PRESENT EMBODIMENT | P | $1.2 \times 10^{19}$ | $5.4 \times 10^{19}$ | $6.3 \times 10^{17}$ |

| CONDITION | PULSE WIDTH | SURFACE TEMPERATURE | ATMOSPHERE |
|---|---|---|---|
| 1 | 500ns | 520°C | IN AIR |
| 2 | 100ns | 500°C | IN VACUUM |
| 3 | 100000fs | 200°C | IN AIR |
| 4 | 10000fs | 55°C | IN AIR |
| 5 | 500fs | 42°C | IN AIR |
| 6 | 200fs | 34°C | IN $N_2$ |
| 7 | 80fs | 32°C | IN VACUUM |
| 8 | 30fs | 27°C | IN $O_2$ |
| THERMAL ANNEAL | — | 700°C(1 MIN.) | |

(B)

| CONDITION | TYPE OF CARRIER | CARRIER CONCENTRATION ($cm^{-3}$) | RESISTIVITY ($\Omega \cdot cm$) |
|---|---|---|---|
| 1 | p | $8.10 \times 10^{16}$ | 6.6 |
| 2 | p | $4.86 \times 10^{17}$ | 1.4 |
| 3 | p | $1.9 \times 10^{18}$ | 0.76 |
| 4 | p | $4.2 \times 10^{18}$ | 0.60 |
| 5 | p | $1.4 \times 10^{19}$ | 0.10 |
| 6 | p | $4.0 \times 10^{19}$ | 0.07 |
| 7 | p | $7.5 \times 10^{19}$ | 0.04 |
| 8 | p | $8.2 \times 10^{19}$ | 0.03 |
| THERMAL ANNEAL | p | $1.81 \times 10^{18}$ | 0.86 |

Fig.14
(A)
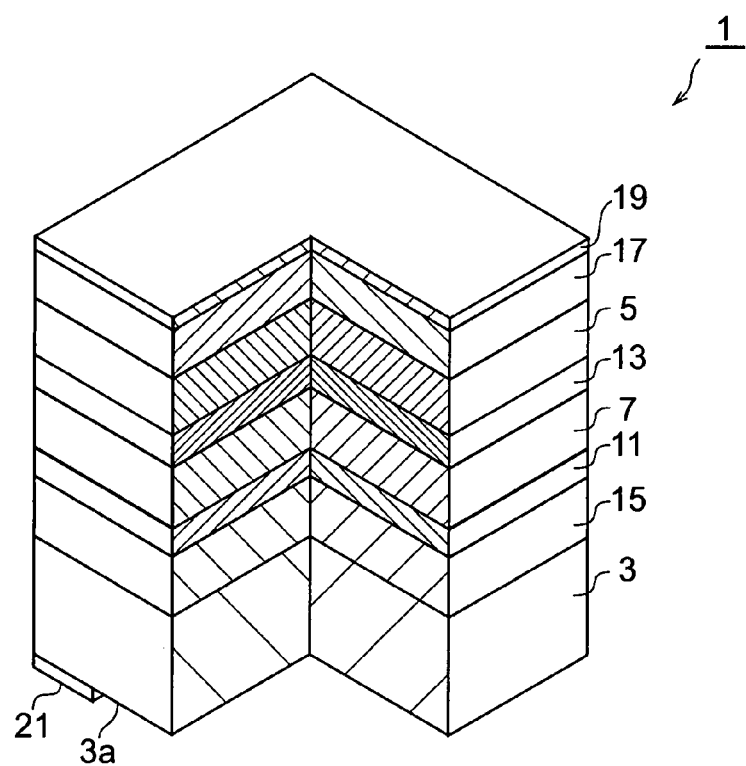
(B)
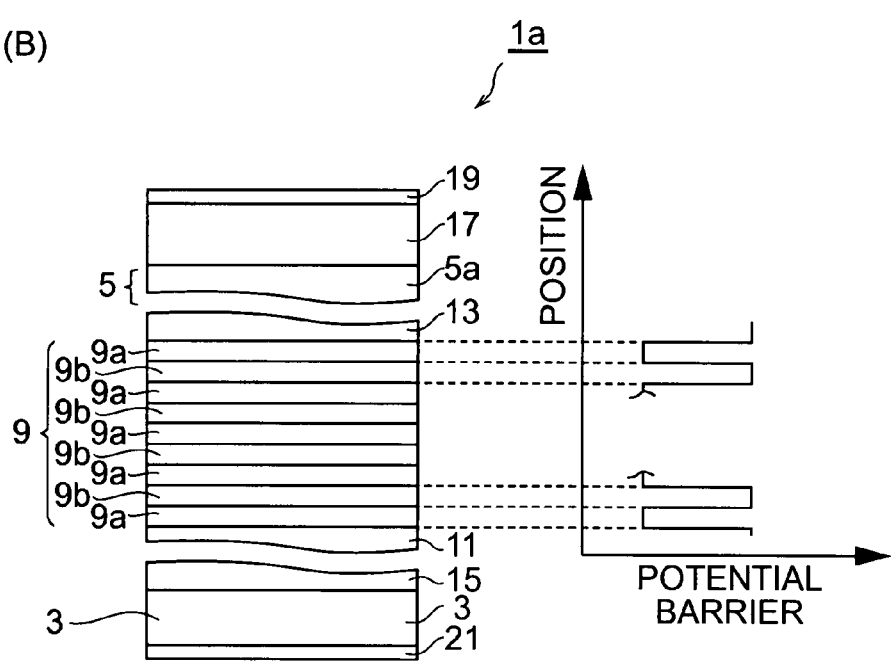

Fig.15
(A)
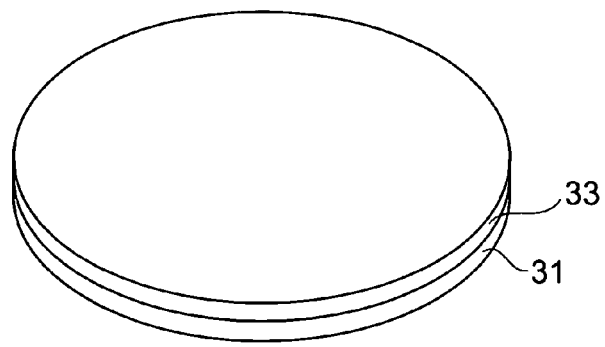
(B)
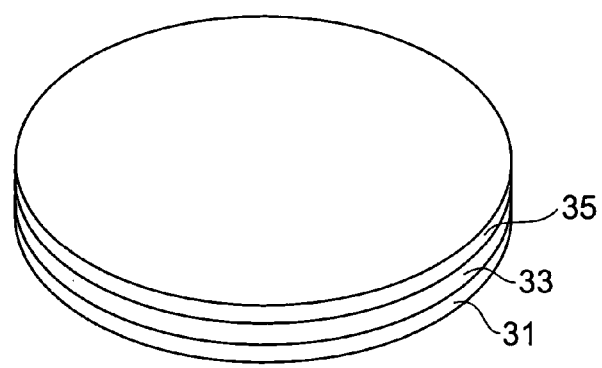
(C)
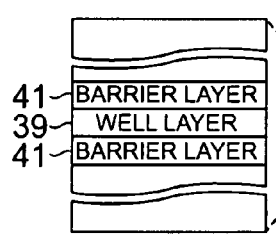
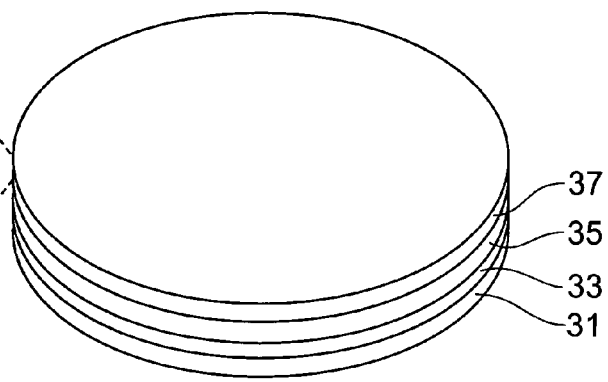

Fig.16
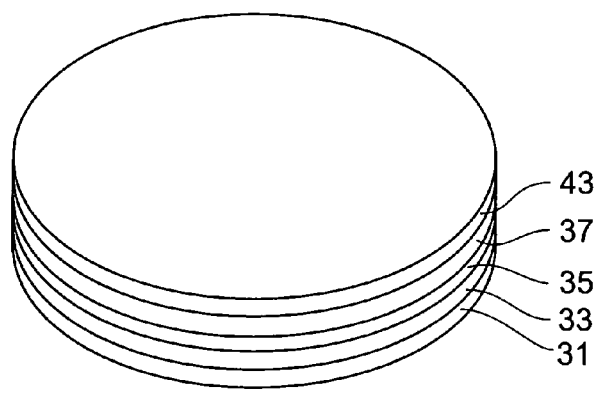
(A)
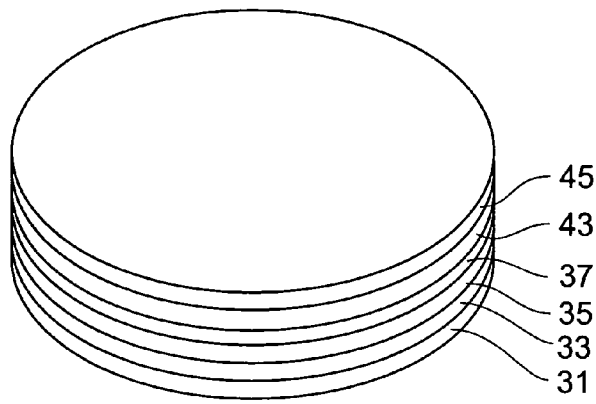
(B)
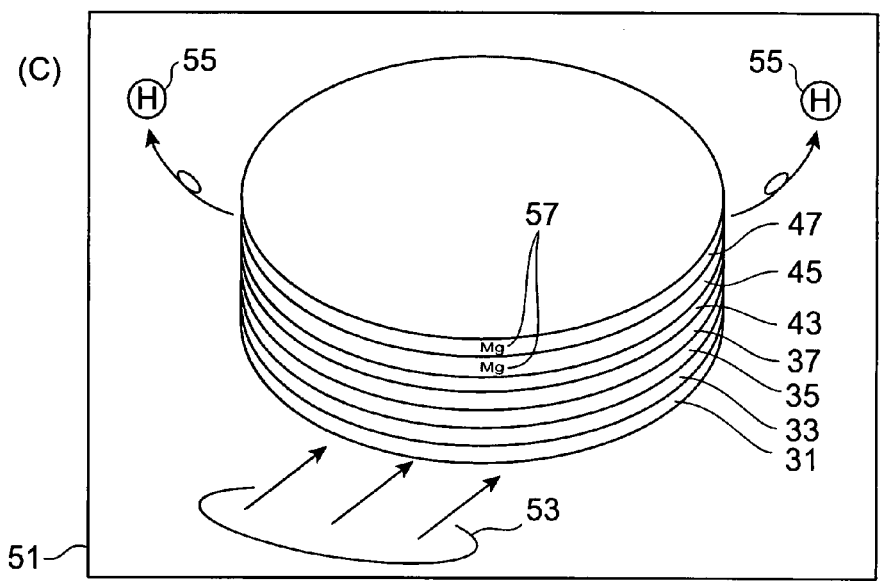
(C)

METHOD FOR FORMING P-TYPE SEMICONDUCTOR REGION, AND SEMICONDUCTOR ELEMENT

TECHNICAL FIELD

The present invention relates to a method of forming a p-type semiconductor region, and a semiconductor device.

BACKGROUND ART

Patent Document 1 (Japanese Patent Application Laid-Open No. 2001-127002) discloses a method of activating a p-type dopant in a semiconductor layer in a GaN semiconductor laser. When laser beam is applied to a nitride-based GROUP III-V compound semiconductor, such as GaN, doped with the p-type dopant Mg to activate the p-type dopant, the laser beam has a photon energy in a range of $E_{g\text{-}real} \pm 0.5$ eV, where $E_{g\text{-}real}$, which is an actually measured bandgap of the semiconductor, is a photon energy for which the absorption coefficient "a" of the semiconductor is equal to a quantity defined by "a=1/d", and "d" is a thickness of the semiconductor in which the dopant is to be activated.

Patent Document 2 (Japanese Patent Application Laid-Open No. 11-224957) discloses that, when a semiconductor layer contains a considerable amount of a group II-element impurity, activation is implemented by applying laser beam of not less than 10 W/cm$^2$ nor more than 500 W/cm$^2$ to the p-type nitride semiconductor layer in which the dopant is not activated. The activation is further promoted if the p-type nitride semiconductor layer is also doped with an n-type dopant.

Patent Document 3 (Japanese Patent Application Laid-Open No. 2000-306854) discloses a method of activating a p-type layer in a gallium nitride (GaN) compound semiconductor device. This method irradiates the p-type layer at a temperature in the range of 200° C. to 500° C. with light containing wavelengths in the range from ultraviolet to visible light, thereby removing hydrogen bound to the p-type dopant in the p-type layer to activate the p-type dopant as an acceptor.

Patent Document 4 (Japanese Patent Application Laid-Open No. 9-266218) discloses a method of forming a p-type II-VI compound semiconductor or GaN compound semiconductor of low-resistance without annealing after crystal growth. The p-type II-VI compound semiconductor or GaN compound semiconductor epitaxially grown by MOCVD is irradiated with pulsed laser beam of the photon energy not less than the bandgap energy of these compound semiconductors to generate electron-hole pairs. Namely, since the pulsed laser beam has the wavelength corresponding to the energy not less than the bandgap energy of the irradiated semiconductor, an electron-hole pair is generated by a single photon. Bonding between the p-type dopant and hydrogen is cut by electric effect of carriers generated from the electron-hole pair, to remove hydrogen from the interior of the p-type compound semiconductor.

Patent Document 1: Japanese Patent Application Laid-Open No. 2001-127002

Patent Document 2: Japanese Patent Application Laid-Open No. 11-224957

Patent Document 3: Japanese Patent Application Laid-Open No. 2000-306854

Patent Document 4: Japanese Patent Application Laid-Open No. 9-266218

DISCLOSURE OF THE INVENTION

Problem to be Solved by the Invention

For realizing semiconductor devices such as nitride semiconductor lasers and nitride light-emitting diodes, we need low-resistance p-type semiconductor films, such as p-type GaN and AlGaN films. For obtaining these films, it is necessary to activate the p-type dopant in the nitride semiconductor region. The reason for it is that the p-type dopant added in crystals during crystal growth may be bound to hydrogen atoms in an atmosphere in a high-temperature state during the growth or immediately after the growth and that the bound dopant is not ionized in a temperature range in which these semiconductor devices operate, normally, around room temperature.

For activating the dopant, there are the methods of cutting the bonding between the dopant and hydrogen by making use of optical irradiation, as described in the aforementioned documents.

The method described in Patent Document 1 uses the light with the photon energy near the energy satisfying the above predetermined relation (a=1/d), where the absorption coefficient "a" of the semiconductor has the thickness d of the semiconductor to be subjected to activation of the impurity. For this reason, the photon energy of the light used in the above method has to be changed according to the thickness of the semiconductor layer to be activated.

The method described in Patent Document 2 adopts the activation using the laser beam with the energy of not less than 10 W/cm$^2$ nor more than 500 W/cm$^2$. This laser beam has a wavelength of a third harmonic of titanium-sapphire laser (340 nm), or a second harmonic of argon gas laser (257 nm). Since this method uses the beam of wavelength shorter than the wavelength corresponding to the bandgap energy, it makes use of single-photon excitation.

The method described in Patent Document 3 includes the step of applying the light having the wavelength components in the range from ultraviolet to visible light, to directly dissociate a proton from a bound substance of the dopant and hydrogen. The proton is neutralized by an electron generated when the GaN semiconductor layer is exposed to the light having the energy larger than the bandgap energy of the GaN semiconductor. This method requires the supply of a large amount of electrons, in addition to the light.

The method described in Patent Document 4 includes the step of removing hydrogen from the interior of the p-type compound semiconductor by the electric effect of carriers, such as electrons and holes, generated by laser irradiation. This method requires generation of electron-hole pairs.

It is an object of the present invention to provide a method of optically activating a p-type dopant in a semiconductor region, without use of thermal annealing, to form a p-type semiconductor region and it is another object of the invention to provide a semiconductor device free from influence of thermal annealing during activation of a p-type dopant.

Means for Solving the Problem

One aspect of the present invention is a method of activating a dopant in a semiconductor to form a p-type semiconductor region, the method comprising: a step of applying a laser beam to a semiconductor region comprised of a semiconductor selected from a group III-V semiconductor, a group II-VI semiconductor, and a group IV semiconductor, and containing hydrogen and a p-type dopant, to activate the p-type dopant by making use of a multiphoton absorption process.

Inventor's experiment shows that the p-type dopant in the semiconductor region is activated by irradiation with pulsed laser light which can cause multi-photon absorption.

The semiconductor region preferably used in the method of the present invention is a gallium nitride compound semiconductor region, and the p-type dopant is at least either one of magnesium and zinc.

Hydrogen atoms are contained in the GaN compound semiconductor region because of its raw materials. It is known that the hydrogen impedes activation of the p-type dopant. According to the present invention, the hydrogen concentration of the GaN compound semiconductor region containing hydrogen and the p-type dopant is decreased by irradiation with pulsed laser light, while the carrier concentration increases in the GaN compound semiconductor region irradiated with the pulsed laser light. Magnesium and zinc are particularly useful as the p-type dopant for the GaN compound semiconductor.

In the method of the present invention, the laser beam is preferably pulsed laser light having a pulse width of not more than 100 nanoseconds. In the method of the present invention, the laser beam is more preferably pulsed laser light having a pulse width of not more than 10000 femtoseconds.

In the method of the present invention, the step of activating the p-type dopant is performed while applying at least either one of an electric field and a magnetic field to the semiconductor region. Since optically activated hydrogen interacts with at least either one of the electric field and the magnetic field applied, it becomes more likely to be taken out of the semiconductor region.

In the method of the present invention, a wavelength of the laser beam may be longer than a wavelength corresponding to a bandgap of material of the semiconductor region. Since the pulsed laser beam to cause multi-photon absorption is applied to the semiconductor region, the wavelength of the laser beam may be longer than the wavelength corresponding to the bandgap energy of the material of the semiconductor region.

In the method of the present invention, the laser beam is preferably a laser beam having an intensity of not less than $10^4$ W/cm$^2$.

In the method of the present invention, the semiconductor region may be patterned by use of direct writing with the laser beam. The direct writing allows us to form an activated region in a two-dimensional pattern in the semiconductor region. The direct writing also permits us to form an activated region in a three-dimensional pattern in the semiconductor region.

Another aspect of the present invention is a semiconductor device comprising: a semiconductor layer containing hydrogen and a p-type dopant, the semiconductor layer including a first region containing the p-type dopant activated by multi-photon absorption process by irradiation with a laser beam, and the semiconductor layer is made of at least one selected from a group III-V semiconductor, a II-VI semiconductor, and a IV semiconductor, and.

Inventor's experiment shows that the p-type dopant in the semiconductor region is activated by irradiation with pulsed laser beam which can induce multiphoton absorption. According to the present invention, the temperature of the semiconductor layer will not increase over the temperature of not less than 400° C. by the irradiation with the pulsed laser light. Therefore, the semiconductor device is free of thermal influence during the activation of the dopant.

In the semiconductor device of the present invention, the semiconductor layer can comprise a second region having a hydrogen concentration larger than a hydrogen concentration of the first region. In the semiconductor layer, a wanted region is selectively activated according to the semiconductor device.

In the semiconductor device of the present invention, the semiconductor region is preferably a group III nitride semiconductor layer. The group III nitride semiconductor layer can be a GaN compound semiconductor layer, and the p-type dopant can be at least either one of magnesium and zinc.

The group III nitride semiconductor layer contains hydrogen coming from its raw materials. The hydrogen therein impedes activation of the p-type dopant. According to the present invention, the hydrogen concentration of the group III nitride semiconductor layer containing hydrogen and the p-type dopant is decreased by irradiation with pulsed laser light. This results in increasing the carrier concentration of the group III nitride semiconductor layer irradiated with the pulsed laser light. Magnesium and zinc are particularly useful as the p-type dopant for the group III nitride semiconductor.

This group III nitride semiconductor is, for example, $Al_X In_Y Ga_{1-X-Y} N$ (where X is equal to or more than zero and equal to or less than one and Y is equal to or more than zero and equal to or less than one).

In the semiconductor device of the present invention, the first region can be patterned in one of the following: in a surface of the semiconductor layer; in an interior of the semiconductor layer; and in both of the surface and the interior. In the semiconductor device of the present invention, the first region is patterned on the surface of the substrate. This permits the formation of an activated region in a two-dimensional pattern in the semiconductor region.

The semiconductor device of the present invention preferably comprises an n-type nitride semiconductor layer; and an active layer provided between the n-type nitride semiconductor layer and the semiconductor layer. The semiconductor device of the present invention can be a light-emitting element. Since there is no thermal influence during activation of the p-type dopant, the dopant is prevented from diffusing due to heat of activation annealing. The light-emitting device can be a laser diode, a light-emitting diode, or the like.

Effect of the Invention

As described above, the present invention provides the method of optically activating the dopant in the semiconductor region without use of thermal annealing to form the p-type semiconductor region and also provides the semiconductor device free of influence of thermal annealing during activation of the dopant.

BRIEF DESCRIPTION OF THE DRAWINGS

The above objects and other objects, features, and advantages of the present invention will become more readily apparent from the following detailed description of preferred embodiments of the present invention with reference to the accompanying drawings.

FIG. 1 is a drawing showing a method of activating a dopant in a semiconductor region to form a p-type semiconductor region.

FIG. 4 is a drawing showing a method of activating a dopant in a semiconductor region to form a p-type semiconductor region according to as a modified example of the embodiment.

FIG. 6 is a drawing showing characteristics of a semiconductor film activated by a method according to an embodiment of the present invention.

FIG. 7 is a drawing showing characteristics of semiconductor films activated by a method according to an embodiment of the present invention.

FIG. 14 is a drawing showing a nitride semiconductor device according to a third embodiment, and a nitride semiconductor device according to a modified example of the third embodiment.

FIG. 15 is a drawing showing steps in a method of forming a nitride semiconductor device according to a fourth embodiment.

FIG. 16 is a drawing showing steps in the method of forming the nitride semiconductor device according to the fourth embodiment.

DESCRIPTION OF REFERENCE SYMBOLS

Figure 2:
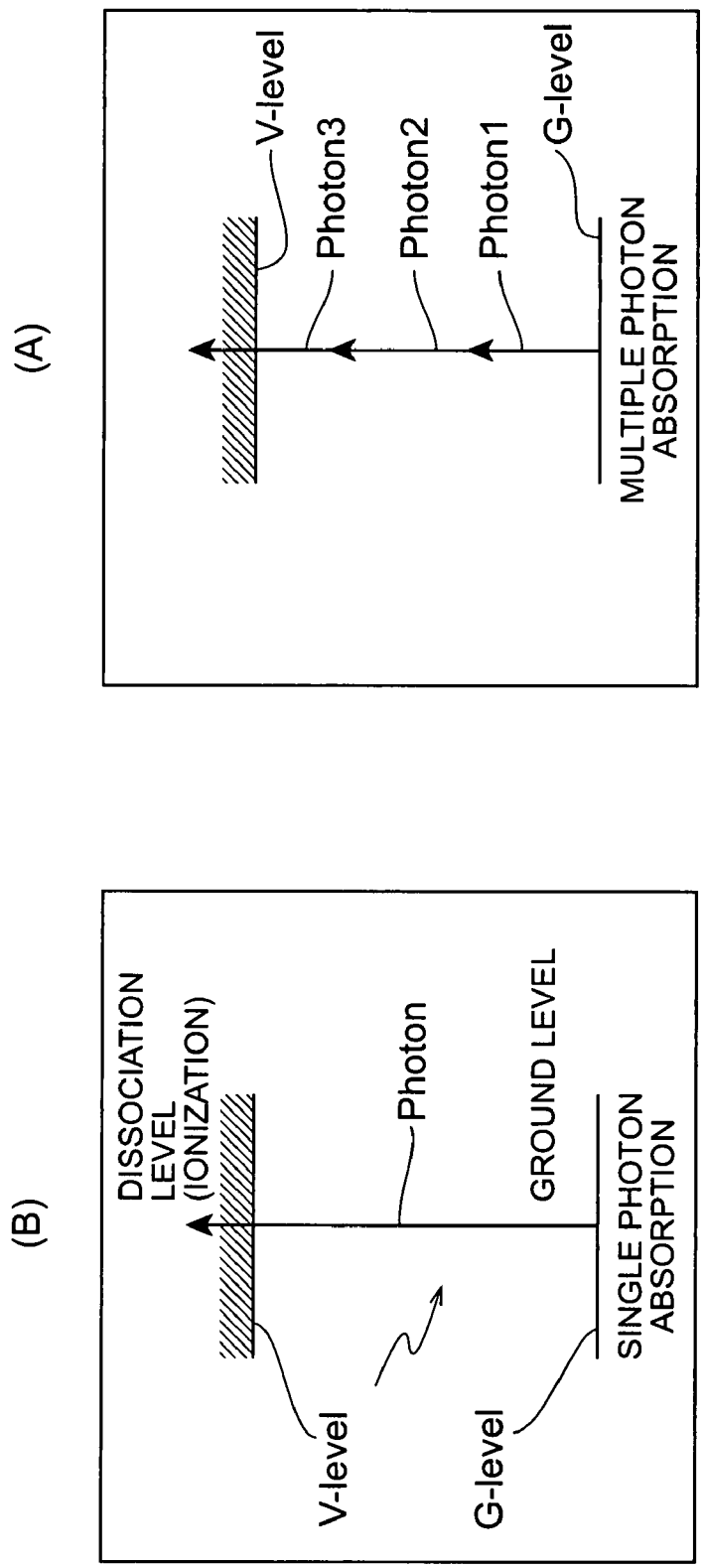
FIG. 2 is a drawing for explaining multiphoton absorption used in methods according to embodiments of the present invention, and single-photon absorption.

101 . . . metal organic vapor phase epitaxy apparatus; 103 . . . substrate; 105 . . . GaN buffer film; 107 . . . undoped GaN film; 109 . . . GaN film; E1, E2 . . . epitaxial substrates; 111, 111a, 111b . . . short pulsed laser light emitters; 109a . . . p-type GaN film; $L_{B1}$ . . . pulsed laser light; 113 . . . desorbed hydrogen; 117 . . . gallium nitride semiconductor region; G-level . . . ground state; Photon1, Photon2, Photon3, . . . Photon photons; V-level . . . vacuum level; 121 . . . laser oscillator; 123 . . . aperture; 125 . . . lens; 127 . . . stage; 129b, 129c, 129a . . . mirrors; $P_{TRAIN}$ . . . laser pulse train; 131 . . . device; 133 . . . GaN buffer film; 135 . . . undoped GaN film; 137 . . . InGaN buffer film; 139 . . . AlGaN film; 139a . . . p-type GaN film; 143 . . . airtight container; 145 . . . a gas supply path; 145b . . . exhaust path; 147 . . . pressure gauge; 1 . . . nitride semiconductor device; 3 . . . substrate; 5 . . . semiconductor region; 7 . . . group III nitride semiconductor layer; 9 . . . quantum well region; 9a . . . well layers; 9b . . . barrier layers; 11 . . . first cladding layer; 13 . . . second cladding layer; 15 . . . group III nitride semiconductor layer; 17 . . . contact layer; 19 . . . anode electrode; 21 . . . cathode electrode; 31 . . . gallium nitride substrate; 33 . . . gallium nitride film; 35 . . . first cladding film; 37 . . . active region; 39 . . . well film; 41 . . . barrier film; 43 . . . second cladding film; 45 . . . group III-V compound semiconductor film; 47 contact film; 51 short pulsed laser emitter; 53 . . . short pulsed laser light; 55 . . . desorbed hydrogen; 57 . . . p-type dopant; 10 . . . sapphire substrate; 2 . . . GaN layer; 4 . . . InGaN layer.

Best Mode for Carrying out the Invention

The teachings of the present invention can be readily understood in view of the following detailed description with reference to the accompanying drawings presented by way of examples. Subsequently, embodiments of the present invention will be described with reference to the accompanying drawings. When possible, parts identical to each other will be referred to with reference symbols identical to each other.

First Embodiment

Area (A) in FIG. 1 is a drawing showing a method of forming a p-type semiconductor region by activating a dopant in a semiconductor region. Area (B) in FIG. 1 is a drawing showing the method of forming the p-type semiconductor region by activating the dopant in the semiconductor region. This semiconductor region can be at least one semiconductor selected from a group III-V semiconductor, a group II-VI semiconductor, and a group IV semiconductor, and the description hereinafter will concern description of a method of forming a p-type GaN semiconductor region by activating a dopant in a GaN semiconductor region. A GaN compound semiconductor film contains hydrogen therein film because of its raw materials for film formation, and it is known that this hydrogen impedes activation of the p-type dopant.

As shown in area (A) in FIG. 1, the semiconductor region is formed on a substrate 103. This semiconductor region includes a semiconductor film or a plurality of semiconductor films as described below. In an example, the substrate 103 is set in a film-forming apparatus, such as a metal organic vapor phase epitaxy apparatus 101, and a GaN buffer film 105, an undoped GaN film 107, and a GaN film 109 containing a p-type dopant are successively grown on the substrate 103 to form an epitaxial substrate "E1." A specific example of these films is as follows:

substrate 103: C-plane sapphire substrate 600 μm;
GaN buffer film 105: 25 nm;
undoped GaN film 107: 2 μm;
GaN film 109: 500 nm.

The p-type dopant can be magnesium, zinc, or the like. The semiconductor film 109 contains hydrogen, which is contained in source gases, in addition to the p-type dopant.

As shown in area (B) in FIG. 1, the epitaxial substrate "E1" is set in a short pulsed laser light emitter 111. A laser beam "$L_{B1}$" is applied to a part or the whole of the surface of the epitaxial substrate "E1" to activate the p-type dopant by making use of the multiphoton absorption process. A laser light source to be used for irradiation with the laser beam is, for example, a titanium-sapphire femtosecond laser having the following properties:

wavelength of laser beam: 700-900 nm;
pulse width of laser beam: 3000 femtosec or less;
spot diameter: 5.4 μm-67.9 μm;
laser intensity: $1.2 \times 10^5 - 2 \times 10^{12}$ W/cm².

Moving speeds of the sample are, for example, as follows:
moving speed in X-direction: 2.3 mm/sec;
step width of Y-directional movement: 3 μm.

The pulse width is measured with an autocorrelator using a Michelson interferometer, and an oscilloscope. The laser light intensity "$P_L$" (W/cm²) is a value ($P_L = E_P/(S_B \times T_P)$) obtained by dividing a pulse energy "$E_P$" (J) of laser light by a spot area "$S_B$" (cm²) and a pulse width "$T_P$" (sec). The spot area can be measured, for example, with a beam profiler. The spot area "$S_B$" is an area of a spot of the laser beam and indicates a diameter of a spot where measured light is $1/e^2$ or 86.4% of the beam.

According to Inventor's experiment, the p-type dopant in the semiconductor region 117 is activated when irradiated with the pulsed laser beam "$L_{B1}$" to induce multiphoton absorption, thereby forming a p-type GaN film 109a. The irradiation with the pulsed laser beam $L_{B1}$ causes no substantial raise in the temperature of the semiconductor film, and, therefore, the laser-irradiated region is prevented from being heated up to several hundred degrees centigrade at which constituent atoms in crystals migrate. In addition, the surface of the semiconductor region can be directly irradiated with the laser beam without use of a cover film such as a cap layer. Namely, since no heat is applied for activation of the dopant, nitrogen atoms in the semiconductor region are prevented from migrating out of the semiconductor region due of thermal influence.

During this activation, hydrogen 113 in the semiconductor film 109 desorbs under irradiation with the pulsed laser beam $L_{B1}$ that can causes multiphoton absorption. As a consequence, the hydrogen concentration of the semiconductor film 109a in the GaN semiconductor region 117 containing both hydrogen and the p-type dopant, is decreased by the irradiation with the pulsed laser beam $L_{B1}$ and the carrier concentration increases in the GaN semiconductor film 109a irradiated with the pulsed laser beam $L_{B1}$.

The semiconductor region may be scanned with the short pulsed laser beam to form a patterned, activated region in the semiconductor region. A two-dimensional pattern can be formed in the semiconductor region by writing with a mask or by direct writing. It is also possible to selectively activate the semiconductor film located below the top semiconductor layer, by writing with a mask or by direct writing. This results in forming the activated region in a three-dimensional pattern in the semiconductor region.

In an example, although the wavelength of the laser beam is longer than a wavelength corresponding to the bandgap of the material of the semiconductor region, the p-type dopant in the semiconductor can also be activated by irradiating the semiconductor film with the pulsed laser beam to cause multiphoton absorption.

Area (A) in FIG. 2 is a drawing for explaining the multiphoton absorption used in the method according to the present embodiment, and area (B) in FIG. 2 a drawing for explaining single-photon absorption. The multiphoton absorption is absorption of a plurality of photons Photon1, Photon2, and Photon3 (a plurality of photons having substantially the same photon energy) from the ground state G-level to cause a transition to a higher level than the vacuum level V-level. This multiphoton absorption enables activation of the p-type dopant in the semiconductor. On the other hand, in the method described in Patent Document 4 and others, the absorption of a single photon "Photon" shown in area (B) in FIG. 2, instead of the multiphoton absorption as shown in area (A) in FIG. 2, causes a transition from the ground state G-level to a level higher than the vacuum level V-level. It is preferable to use the laser beam having the intensity of not less than $10^4$ W/cm$^2$, in order to induce the multiphoton absorption.

Figure 3:
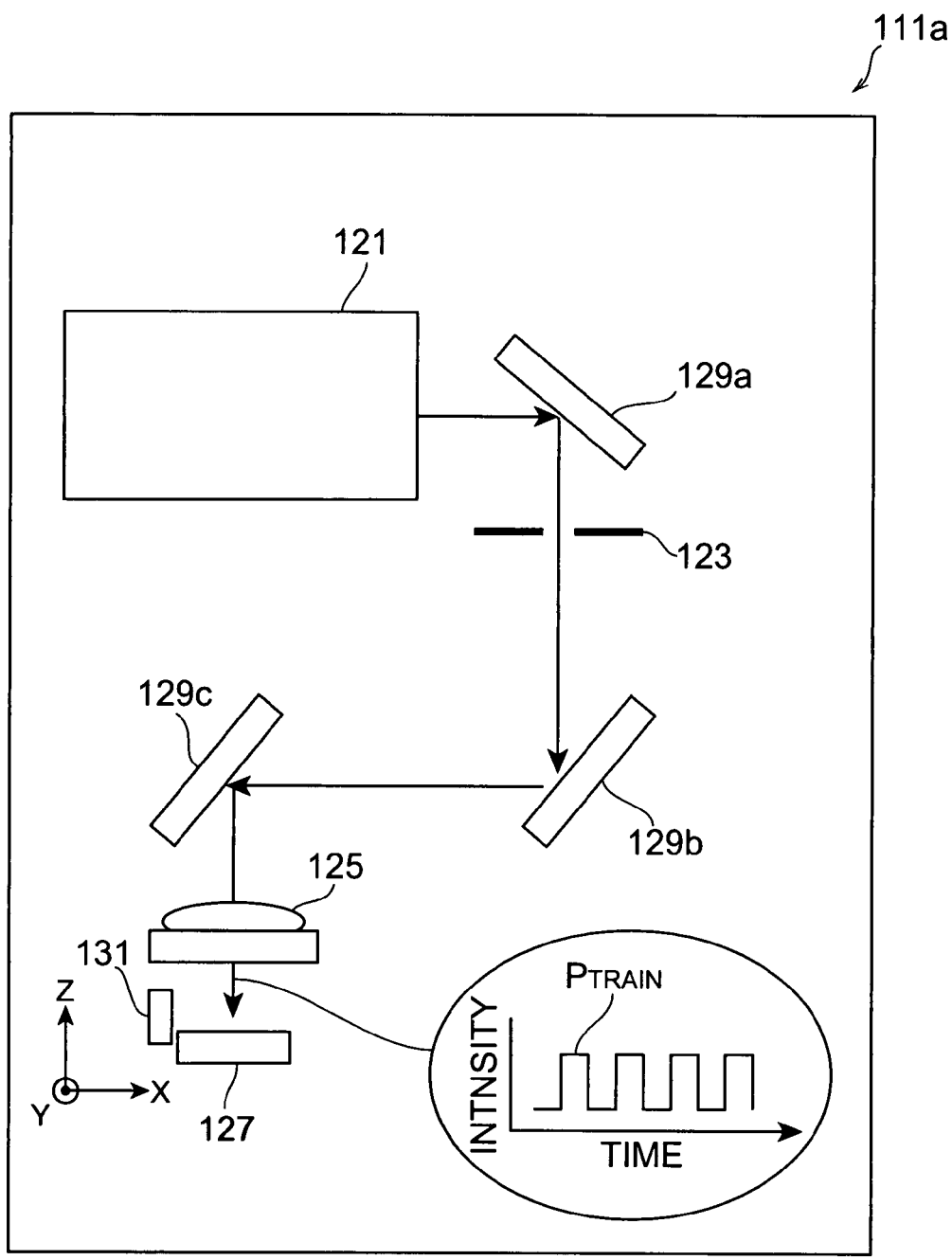
FIG. 3 is a drawing showing a example of a narrow pulsed laser light emitter which can be used in a method of forming a p-type group III nitride semiconductor region.

FIG. 3 is a drawing showing a example of the short pulsed laser light emitter which can be used in the method of forming the p-type group III nitride semiconductor region. The short pulsed laser light emitter 111a has a laser oscillator 121 capable of generating a pulsed laser beam to cause multiphoton absorption, an aperture 123, a lens 125, and a stage 127 on which a target is mounted. In the short pulsed laser light emitter 111a, a first mirror 129a is provided on an optical path from the laser oscillator 121 to the aperture 123. Second and third mirrors 129b and 129c are arranged on an optical path from the aperture 123 to the lens 125. The stage 127 can include a driving mechanism that can move the support stage for mounting of the target in a plurality of directions (e.g., X-and Y-directions). A laser pulse train "$P_{TRAIN0}$" from the laser oscillator 121 is narrowed down by the aperture 123 and then converted into a desired beam diameter by the lens 125. The laser pulse train "$P_{TRAIN}$" of the converted beam diameter is guided onto the semiconductor region to cause multiphoton absorption on the surface of the semiconductor region or inside the semiconductor region. By scanning the semiconductor region with the laser pulse train "$P_{TRAIN}$" by use of the short pulsed laser light emitter 111a, the p-type dopant can be activated in part or in the whole of the semiconductor region.

In this short pulsed laser light emitter 111a, the pulse width of the pulsed laser beam is preferably 10000 femtoseconds or less and this provides an advantage of reducing heat generation in the semiconductor due to the laser irradiation. The pulse width of the pulsed laser beam is preferably 100 nanoseconds or less and this provides an advantage of suppressing the enhancement of lattice vibration by the laser irradiation and further decreasing of the heat generation in the semiconductor.

The short pulsed laser light emitter 111a can include an electromagnetic field generating device 131 for forming an electromagnetic field (at least either one of an electric field and a magnetic field) to be applied so as to cross the epitaxial substrate mounted on the stage 127. During the activation of the p-type dopant, this electromagnetic field generating device 131 can be used to apply at least either one of the electric field and the magnetic field to the semiconductor region. Hydrogen reacting optically interacts with the applied electromagnetic field and becomes more likely to be taken out of the semiconductor region. For example, when a bias, e.g., voltage of three volts, is applied between the semiconductor region (plus side) and the chamber (earth side), hydrogen can be more efficiently taken out.

Areas (A) and (B) in FIG. 4 are drawings showing a method of activating a dopant in a semiconductor region to form a p-type semiconductor region, as a modification example of the present embodiment. As shown in area (A) in FIG. 4, a substrate 103 is placed in a film-forming apparatus, such as the metal organic vapor phase epitaxy apparatus 101, and a GaN buffer film 133, an undoped GaN film 135, an InGaN film 137, and an AlGaN film 139 containing a p-type dopant are successively grown on the substrate 103 to form an epitaxial substrate "E2." A specific example of these films is as follows:

substrate 103: C-plane sapphire substrate 600 μm;
GaN buffer film 133: 25 nm;
undoped GaN film 135: 2 μm;
InGaN film 137: 50 nm;
AlGaN film 139: 350 nm.

The p-type dopant can be magnesium, zinc, or the like. The semiconductor film 139 contains hydrogen, which comes from source gases, in addition to the p-type dopant.

As shown in area (B) in FIG. 4, the epitaxial substrate "E2" is set in the short pulsed laser light emitter 111. The laser beam "$L_{B1}$" is applied to a part or the whole of the surface of the epitaxial substrate "E2" to activate the p-type dopant by use of the multiphoton absorption process. The laser light source for the irradiation with the laser beam is, for example, a titanium-sapphire femtosecond laser having the following properties:

wavelength λ of laser beam: 700-900 nm;
pulse width of laser beam: 100 femtosec or less;
output power of laser: 1 nJ-10 mJ.

The moving speeds of the sample used can be, for example, as follows:
moving speed in X-direction: 2.3 mm/sec
step width of Y-directional movement: 3 μm.

This results in forming a p-type GaN film 139a. As described in this example, the activation of p-type dopant that makes use of the multiphoton absorption is also applicable to activation of the p-type dopant in the AlGaN film, as well as the GaN film. The method described in the present embodiment is not limited to GaN and AlGaN, but is also applicable to the other group III nitrides, such as InGaN, AlInGaN, AlN, InN, and so on. Without no limitations to the above, the aforementioned method is also applicable to silicon, diamond, amorphous carbon, carbon nanotube, carbon nanohorn, group IV semiconductors such as silicon and germanium, group II-VI compound semiconductors such as ZnSe, ZnS, ZnTe, CdSe, and CdTe, and group III-V compound semiconductors such as GaN, AlN, GaAs, GaP, AlP, AlAs, InP, InAs, AlSb, GaSb, and InSb. Furthermore, the present invention is widely applicable to any material, e.g., Si, GaAs, InP, AlGaInP, and so on, that demonstrates a phenomenon in which passivation causes inactivation of the acceptor by hydrogen.

Figure 5:
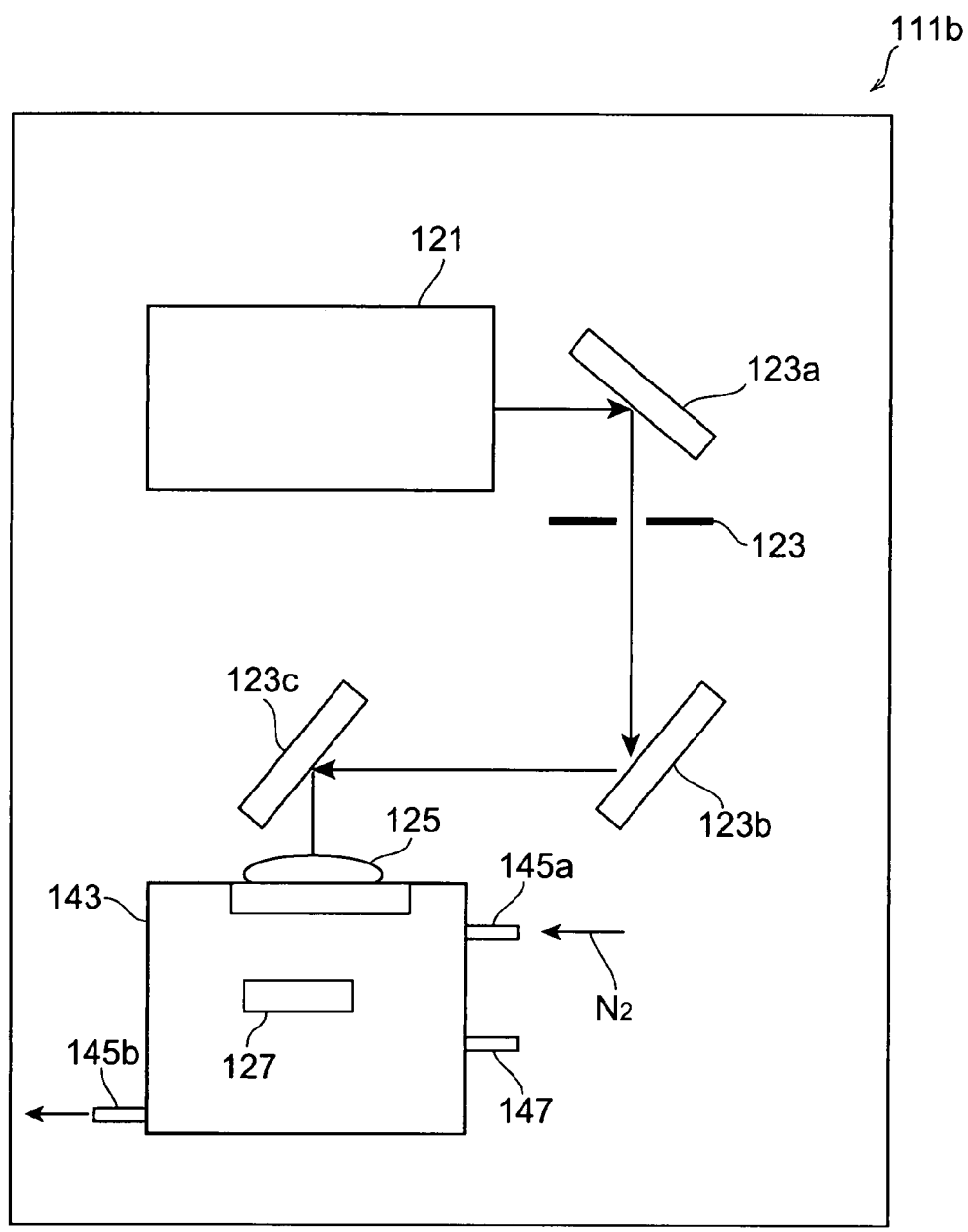
FIG. 5 is a drawing showing a configuration of a short pulsed laser light emitter of a modification example.

FIG. 5 is a drawing showing an embodiment of a short pulsed laser light emitter as a modified example. In the short pulsed laser light emitter 111b, a stage 127 is located in an airtight container 143. A lens 125 is attached to the airtight container 143 and the pulsed laser beam is guided through the lens 125 onto the semiconductor region positioned on the stage 127. The airtight container 143 has a gas supply path 145a and an exhaust path 145b for providing a desired gas atmosphere such as a nitrogen atmosphere. The apparatus includes a pressure gauge 147 for monitoring the pressure of the gas atmosphere.

FIG. 6 is a drawing showing characteristics of a semiconductor film activated by the method of the present embodiment. According to this result, when the semiconductor region is irradiated with the pulsed laser beam in accordance with the present embodiment, the carrier concentration of the semiconductor region becomes substantially equal to or larger than that of the semiconductor region activated by conventional thermal annealing.

Area (A) in FIG. 7 is a drawing showing characteristics of semiconductor films activated by the method of the present embodiment. The pulse width of the laser beam is in the range of 30 femtosec (fs) to 500 nanosec (ns), the laser beam is applied to the semiconductor region under various irradiation conditions, and the carrier concentration and resistivity are measured for the irradiated semiconductor region. According to the result of these measurements, the carrier concentrations of the semiconductor regions according to the present embodiment are practical values, when compared with the carrier concentration of the semiconductor region activated by conventional thermal annealing.

Area (A) in FIG. 7 is a drawing showing the temperature of the sample, the pulse width, and the type of the atmosphere during the laser irradiation for the activation by the method of the present embodiment. This temperature is measured by use of a thermosensitive tape seal, a radiation thermometer, and a thermocouple buried in a sample support jig. The temperature of the atmosphere is 27° C.

Area (B) in FIG. 7 is a drawing showing characteristics of semiconductor films activated. Area (B) in FIG. 7 is a drawing showing the carrier concentrations and resistivities of the semiconductor regions irradiated with the laser beam under the conditions shown in area (A) in FIG. 7. The carrier concentrations and resistivities are measured at room temperature, 19 degrees centigrade. The result shown in area (B) will be described below.

Condition 1:
Since the carrier concentration is also increased by the irradiation with the laser beam having the pulse width of 500 ns (and longer than 500 ns), the p-type dopant in the semiconductor region is activated. The irradiation with the laser beam increases the temperature of the semiconductor region to 500 degrees centigrade.

Condition 2:
Since the carrier concentration is also increased by the irradiation with the laser beam having the pulse width of 100 ns (and below 100 ns), the p-type dopant in the semiconductor region is activated. The irradiation with the laser beam causes an increase in the temperature of the semiconductor region. The activation in Condition 2 is equivalent to or better than the activation in Condition 1. In these conditions (Condition 1 and Condition 2), the irradiation with the laser beam increases the temperature of the surface of the semiconductor region to high temperature not less than several hundred degrees centigrade.

Conditions 3-8:
The irradiation with the laser beam having the pulse width of not more than 100000 fs causes a relatively small increase in the temperature of the surface of the semiconductor region and the surface temperature is 200 degrees centigrade or lower. The temperature of this level causes no substantial influence of heat and can effect activation of the dopant. The smaller the pulse width of the laser beam, the smaller the resistivity. Namely, the degree of activation is largely increased by the irradiation with the laser beam. Particularly, the irradiation with the short pulsed laser of not more than 10000 fs causes no substantial increase in the temperature of the surface of the semiconductor region and can activate the semiconductor region without influence of heat thereon. The carrier concentration of the semiconductor region according to the present embodiment becomes substantially equivalent to or larger than that in the activation by thermal annealing.

In the present embodiment, as described above, the dopant in the semiconductor film is activated by irradiating the semiconductor region containing hydrogen and the dopant, with the laser beam having the light intensity capable of causing the optical reaction through the multiphoton absorption process to cause dissociation of the hydrogen from at least a part of a bound substance of the dopant and hydrogen, in order to activate the dopant.

Since the present embodiment uses the irradiation with the laser beam of short pulses as described above, the semiconductor region does not show any such temperature increase as to thermally degrade the characteristics of the semiconductor region. Since the activation method utilizes the multiphoton absorption reaction induced by the irradiation with the laser beam the pulse width and laser beam power of which are properly selected, there are no restrictions on the wavelength of the laser beam. The method utilizing the optical reaction with the laser beam of short pulses, can prevent the semiconductor region from suffering damage due to the laser beam irradiation. In addition, desorption of hydrogen can be promoted by applying an electromagnetic field to the semiconductor region.

Since the semiconductor device is not subject to an increase of the temperature, different from the thermal annealing, the activation does not degrade the characteristics of the semiconductor device. When the writing of a pattern is performed by scanning with the laser beam, any desired part of the semiconductor region can be selectively activated for the semiconductor device. It is also possible to selectively activate an interior region apart from the surface of the semiconductor as well as the surface of the semiconductor irradiated with the laser beam. The hydrogen concentration of the activated region is smaller than the hydrogen concentration of the other region, and the difference is, for example, $1 \times 10^{17}$ (at/cm$^3$) or more, approximately $4 \times 10^{20}$ (at/cm$^3$). The carrier concentration of the activated region is larger than the carrier concentration of the other region and the difference is, for example, $1 \times 10^{16}$ (cm$^{-3}$) or more, approximately $2 \times 10^{18}$ (cm$^{-3}$).

Second Embodiment

A method of producing a p-type GaN semiconductor film according to the second embodiment will be described below. This production method comprises the following steps (A) and (B):

(A) first step: prepare a GaN semiconductor film doped with Mg and containing hydrogen;

(B) second step: irradiate this GaN semiconductor film with a short pulsed laser beam.

Figure 8:
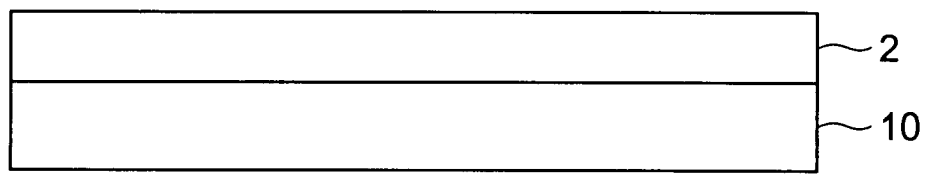
FIG. 8 is a side view of a substrate including a GaN semiconductor film.

First, the step (A) will be described. FIG. 8 is a side view of a substrate including a GaN semiconductor film. In the present example, the GaN semiconductor film is a GaN layer 2 formed on a sapphire substrate (support substrate) 10. In this step (A), steps (A1) and (A2) below are successively executed.

(A1): Substrate Cleaning Step

The sapphire substrate 10 is placed in a Metal Organic Vapor Phase Epitaxy (MOVPE) apparatus. The MOVPE method uses organometallic materials such as TMG (trimethyl gallium), TMA (trimethyl aluminum), and TMI (trimethyl indium), NH$_3$ (ammonia) gas, etc. to epitaxially grow a nitride film (e.g., group III nitride) containing at least one element of Ga, Al, and In, on the substrate placed in a reaction chamber of the MOVPE apparatus. The MOVPE apparatus is equipped with a heater for heating the substrate. After the substrate is set in the MOVPE apparatus, the temperature of the substrate is increased to 1100 degrees centigrade to perform thermal cleaning of the surface of the substrate. A GaN substrate or the like can also be used instead of the sapphire substrate 10.

(A2): GaN Layer Forming Step

A GaN layer 2 is formed on the sapphire substrate 10 in the MOVPE apparatus. The GaN layer 2 is, for example, 0.5 μm thick. Source gases for this film formation are, for example, NH$_3$ and TMG, the substrate temperature is, for example, 1100 degrees centigrade, and the source gases is supplied, for example, for 30 minutes. Biscyclo-pentadienyl magnesium (Cp$_2$Mg) for the p-type dopant is supplied during the growth of the GaN layer 2. A magnesium (Mg) concentration of the GaN layer 2 is $1 \times 10^{20}$ cm$^3$.

Figure 9:
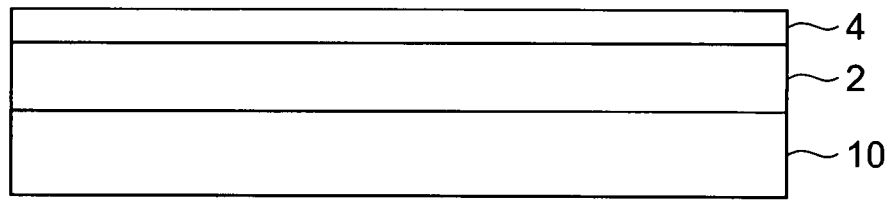
FIG. 9 is a side view of a substrate including another GaN semiconductor film.

FIG. 9 is a side view of a substrate including another GaN semiconductor film. In the present example, the GaN semiconductor film is made of a GaN layer 2 and an InGaN layer 4 which are formed on the substrate 10. This step (B) includes the following steps (B1), (B2), and (B3) successively executed.

(B1): Substrate Cleaning Step

For example, this step can be the same as the aforementioned step (A).

(B2): GaN Forming Step

For example, this step can be the same as the aforementioned step (A2).

(B3): InGaN Layer Forming Step

The InGaN layer 4 is formed on the GaN layer 2 in the MOVPE apparatus. The thickness of the InGaN layer 4 is 0.5 μm. Source gases for this film formation are, for example, NH$_3$, TMG, and TMI, the substrate temperature is, for example, 800 degrees centigrade, and the source gases is supplied, for example, 3 minutes. Cp$_2$Mg for the p-type dopant is supplied during the growth of the InGaN layer 4. The Mg concentration of the InGaN layer 4 is $1 \times 10^{20}$ cm$^{-3}$.

Next, step (C) will be described.

The aforementioned substrate is placed in an atmosphere of a normal-temperature and normal-pressure gas (N$_2$ in this example) and the GaN semiconductor is irradiated with a short pulsed laser beam. The pulse width of the short pulsed laser beam is, for example, 100 fs or less, and thus a femtosecond laser is used.

In this method, since the Mg-doped GaN semiconductor film is irradiated with the short pulsed laser beam (e.g., femtosecond laser light), Mg is activated at a low temperature equal to or less than 100 degrees centigrade, and the p-type GaN semiconductor film can be produced with good characteristics. It is thought that this activation of the p-type dopant results from dissociation of hydrogen atoms in GaN from Mg by the irradiation with the short pulsed laser beam (e.g., femtosecond laser light). Namely, Mg is not activated because of hydrogen (H) taken in from silane (SiH$_4$) or ammonia (NH$_3$) used in the MOCVD or the like. Therefore, it is thought that the irradiation with the femtosecond laser light causes dissociation of hydrogen and this results in activating Mg.

This method does not use a thermal annealing step for activation of Mg which raises the temperature by the laser and suppresses deterioration of the active layer, and therefore, when this semiconductor film is used in a light emitting device, the efficiency of emission thereof is increased.

The second step is carried out at room temperature. Since Mg is activated at low temperature (room temperature), nitrogen (N) can be prevented from losing out of the semiconductor film. Since nitrogen (N) becomes less likely to evaporating out of the surface of the GaN semiconductor film, the contact resistance becomes smaller when an electrode is provided on a group III nitride such as the GaN semiconductor film. Material of the electrode can be, for example, Ni/Au. It is thought that the resistance increases if dissociated hydrogen atoms remain in the GaN semiconductor film. However, hydrogen atoms become more likely to migrate from the GaN semiconductor film to the outside in the present example, so as to prevent the increase of resistance.

The second step may be carried out under atmospheric pressure, but is preferably carried out in an atmosphere containing O$_2$ In this case, since hydrogen atoms are bound to O$_2$, the dissociated hydrogen atoms become still more likely to migrate from the GaN semiconductor film to the outside. It is also possible to use Ar or N$_2$ instead of O$_2$.

The above-described production method uses the GaN layer or InGaN layer as the GaN semiconductor film, but it is not limited thereto and it is also possible to use an AlGaN layer or the like. The AlGaN layer can be formed on the substrate 1 or on the surface of the GaN layer. The AlGaN layer 0.2 μm thick can be formed on this surface in the MOVPE apparatus. The source gases in this case are $NH_3$, TMG, and TMA, the substrate temperature is 1100 degrees centigrade, and the source gases is supplied for three hours. $Cp_2Mg$ for the dopant is supplied during the growth of the AlGaN layer 2. The Mg concentration is $1 \times 10^{20}$ $cm^{-3}$.

EXAMPLE 1

(Experiment Conditions)

A GaN base material produced by (A) step will be referred to as sample "S" (GaN layer). The sample "S" was irradiated with a femtosecond laser beam having the pulse width of not more than 100 femtoseconds. The other parameters of the light source are as follows:
 pulse width: 100 fs or less;
 laser wavelength: 800 nm;
 lens: f=20;
 X-scanning speed of sample: 15.7 mm/sec;
 Y-step of sample: 15 μm;
 spatial output: 860 mW (measured with a power monitor);
 repetition frequency: 80 MHz;
 laser intensity: $5.9 \times 10^5$ ($W/cm^2$).

The sample "S" is fixed to a stage. The surface temperature of the sample "S" is monitored with a high-performance optical thermometer and thermocouple. The dimensions of the substrate of the sample "S" are 10 mm×10 mm. The sample "S" is placed in an $N_2$ normal-pressure atmosphere. The sample "S" is irradiated with the femtosecond laser beam without being heated. The laser beam is focused in a beam diameter of about 50 μm by a planoconvex aspherical lens. The stage was driven to scan a region in the width of 5 mm on the surface of the sample "S." During the scanning with the laser beam, the monitor temperature is stable in the range of 18° C.±2° C. (from 16° C. to 20° C.).

(Evaluation and Results)

Figure 10:
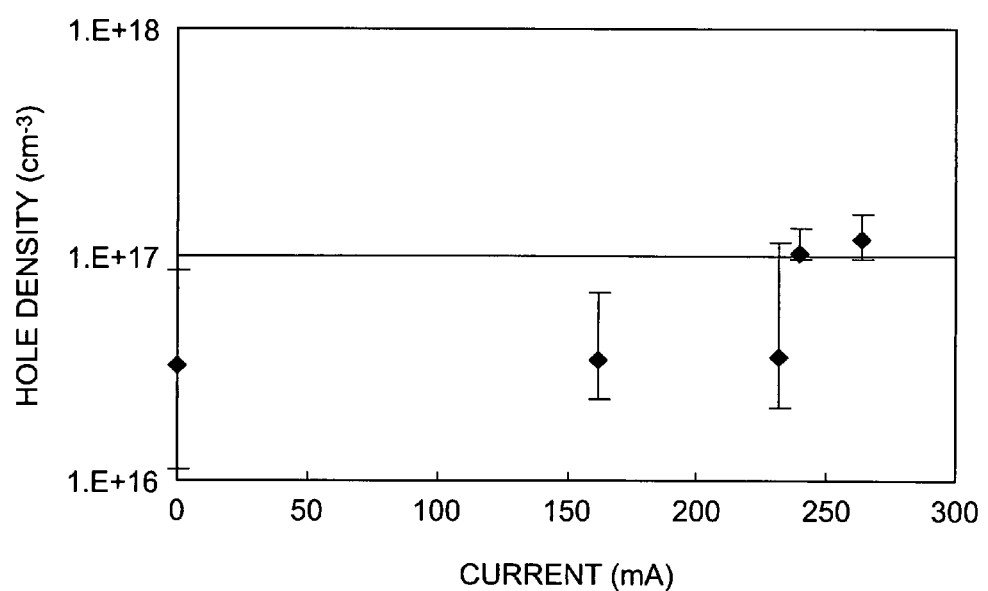
FIG. 10 is a graph showing a relation of hole density ($cm^{-3}$) against electric current (mA) during measurement.
Figure 11:
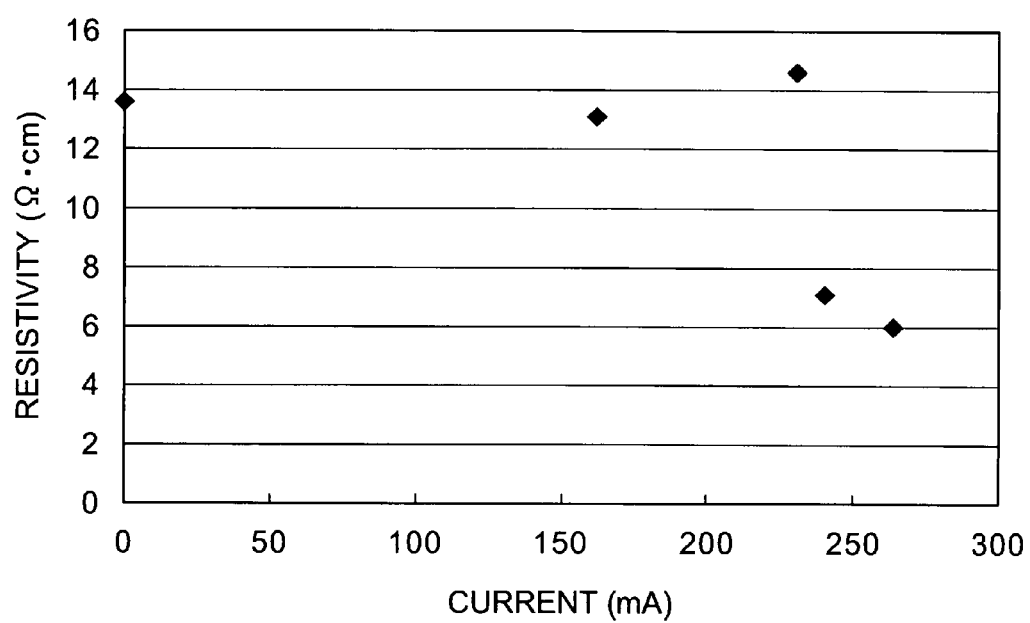
FIG. 11 is a graph showing a relation of resistivity ($\Omega \cdot cm$) against electric current (mA) during measurement.

The Hall effect is measured for the sample "S" that has irradiated with the femtosecond laser beam. FIG. 10 is a graph showing a relation of hole density ($cm^{-3}$) against electric current (mA) used in the measurement. This graph shows that the density of carriers is about $1.5 \times 10^{17}$ $cm^{-3}$. FIG. 11 is a graph showing a relation of resistivity (Ω·cm) against electric current (mA) used in the measurement. According to this graph, the resistivity is 6.0 Ω·cm.

As a comparative experiment, voltage (V)/current (A) characteristics are measured for a sample annealed by use of a heating furnace and for the sample "S" irradiated with the femtosecond laser beam. The temperature of annealing is 700 degrees centigrade and the annealing time is 1 minute.

Figure 12:
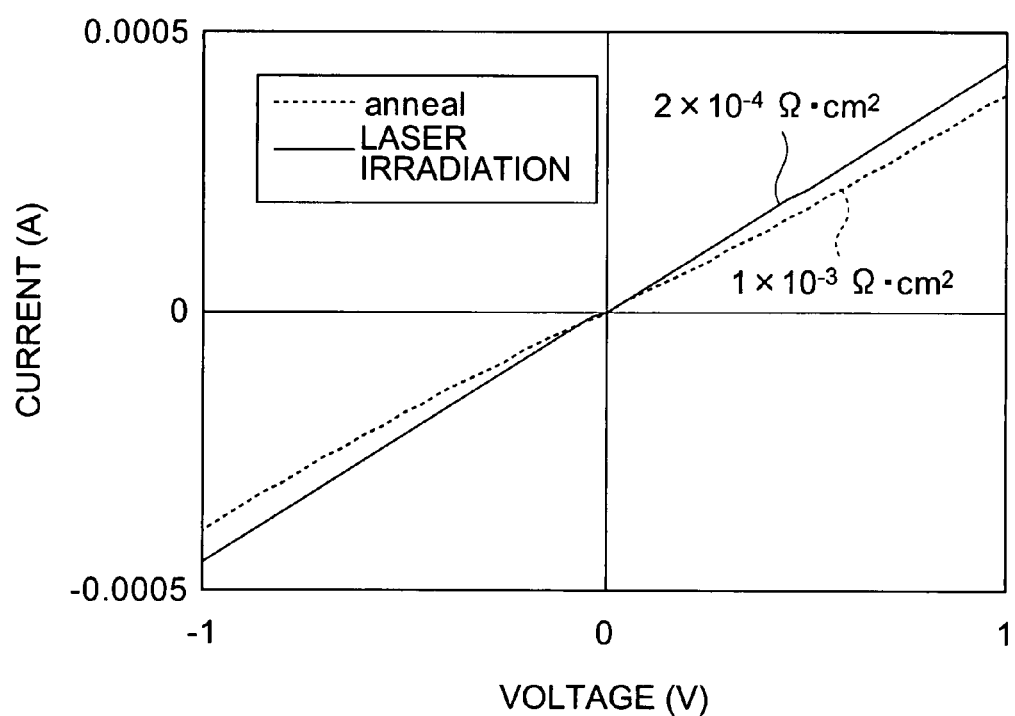
FIG. 12 is a graph showing voltage (V)/current (A) characteristics of an annealed sample and a sample "S" irradiated with laser light.

FIG. 12 is a graph showing the voltage (V)/current (A) characteristics of the annealed sample and the sample "S" irradiated with the. femtosecond laser beam. This is obtained by the TLM (Transmission Line Model) method. An electrode material is, for example, Ni/Au. The contact resistance of the annealed sample (dotted line) is $1 \times 10^{-3}$ Ω·$cm^2$, and the contact resistance of the sample (solid line) irradiated with the femtosecond laser beam is $2 \times 10^{-4}$ Ω·$cm^2$. This proves that the irradiation with the femtosecond laser beam decreases the contact resistance without increase of the sample temperature.

Figure 13:
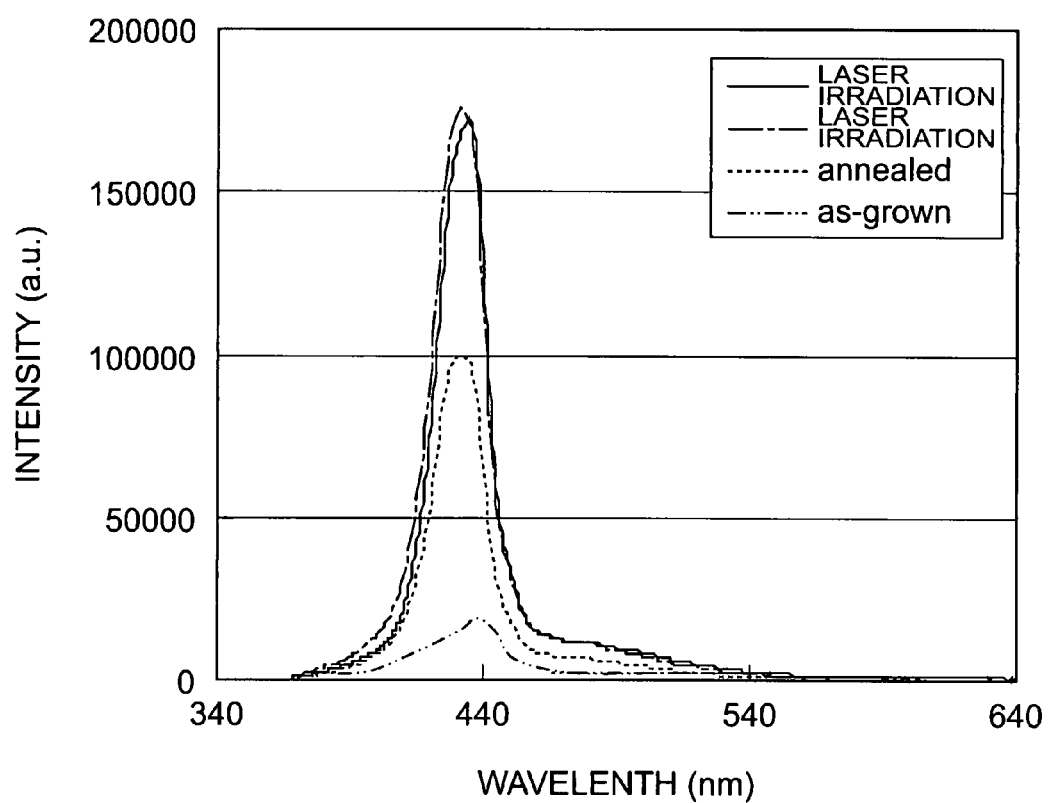
FIG. 13 is a graph showing wavelength dependence of intensity by PL measurement with HeCd laser.

FIG. 13 is a graph showing wavelength dependence of intensity by PL measurement with use of a HeCd laser. Data of a sample before irradiation with the laser beam (as-grown) is indicated by a chain double-dashed line, data of the annealed sample by a dashed line, and data of the sample S irradiated with the laser beam, by a solid line and a chain line.

FIG. 13 suggests the improvement of the activation because the PL intensity of the sample irradiated with the laser beam is larger than the PL intensity of the annealed sample, and shows the suppression of degradation of crystallinity because there is little increase in the half width of the PL spectrum.

Third Embodiment

Area (A) in FIG. 14 is a drawing showing a nitride semiconductor device according to the third embodiment. Area (B) in FIG. 14 is a drawing showing a nitride semiconductor device as a modification example of the third embodiment.

With reference to area (A) in FIG. 14, the nitride semiconductor device 1 comprises a substrate 3 such as a group III nitride substrate, a semiconductor region 5, and a group III nitride semiconductor layer 7. The semiconductor region 5 is comprised of a first group III nitride semiconductor in an example, and a layer of this first group III nitride semiconductor can consist of a compound semiconductor of at least one of indium, gallium, and aluminum, and nitrogen. The group III nitride semiconductor layer 7 is an active region and can made, for example, of a semiconductor containing at least either of gallium and indium, and nitrogen. This active region is provided between the group III nitride substrate 3 and the semiconductor region 5. The semiconductor region 5 contains a p-type dopant and the p-type dopant is magnesium or zinc. Magnesium and zinc act as the p-type dopant in the field of the group III nitride semiconductor. The p-type dopant in the semiconductor region 5 of the p-type group III nitride is activated by irradiation with a short pulsed laser beam.

As far as the pulse width is short, there is little thermal diffusion of energy from the pulsed laser beam in the semiconductor film during the irradiation with the pulsed laser beam, thereby increase efficiency of utilization of energy of the laser beam applied. For generating the laser beam that can cause multiphoton absorption, it is possible to use false pulses, a Q-switch, or a mode-locked oscillation laser. For example, the laser can be a YAG laser, fiber laser, titanium-sapphire laser, excimer laser, or the like.

When the pulse width is of nanosecond order, a plasma can be generated in a medium where the electric field is strong if linear absorption of the medium is small. When the pulse width is of picosecond order, the generation of plasma can be suppressed even if linear absorption of the material is small (because the plasma is generated in the time scale of 100 picoseconds to 1 nanosecond). Interaction between electrons and lattice (phonon coupling) can be reduced by use of the laser beam having the pulse width equal to or less than 100 ns, and, more preferably, the phonon coupling can be more effectively avoided by use of the laser beam having the pulse width of not more than 100 ps, e.g., a picosecond laser beam or a femtosecond laser beam. This can minimize thermal deformation or the like induced by the phonon coupling.

As seen from the above description, the p-type dopant can be activated in the semiconductor region 5 of the group III nitride by use of the present laser beam without any heating furnace, and the semiconductor device is provided without thermal influence due to the activation.

The nitride semiconductor device 1 can include a first cladding layer 11 and a second cladding layer 13 provided above the group III nitride substrate 3. The active region 7 is provided between the first cladding layer 11 and the second cladding layer 13. The first cladding layer 11 can be made, for example, of an undoped or n-type InGaN semiconductor. The second cladding layer 13 can be made, for example, of an undoped or p-type InGaN semiconductor. The p-type dopant in the p-type InGaN semiconductor is activated by irradiation with a short pulsed laser beam.

In the nitride semiconductor device 1 the substrate 3 can be made, for example, of an electroconductive group III nitride, e.g., an n-type semiconductor. The nitride semiconductor device 1 can include a group III nitride semiconductor layer 15 provided on the group III nitride substrate 3. The group III nitride semiconductor layer 15 can be made, for example, of the same semiconductor material as the material of the group III nitride substrate and, specifically, of a GaN semiconductor.

The nitride semiconductor device 1 can include a contact layer 17 provided above the group III nitride substrate 3. The contact layer 17 can be made, for example, of a p-type GaN semiconductor. The p-type dopant in the p-type GaN semiconductor is activated by irradiation with a short pulsed laser beam. The semiconductor region 5 is provided between the contact layer 17 and the cladding layer 13.

The nitride semiconductor device 1 can include an anode electrode 19 provided on the contact layer 17 and can include a cathode electrode 21 provided on a back surface 3a of the III nitride substrate 3. In the nitride semiconductor device 1, either carriers of electrons and holes are supplied from the group III nitride semiconductor layer 15 into the active region 7 and the other carriers of electrons and holes are supplied from the semiconductor region 5 into the active region 7. These carriers are confined in the active region 7 and the active region 7 generates light.

The group III nitride substrate 3 can be, for example, a GaN substrate and can also be an aluminum nitride substrate or sapphire substrate. The first group III-V compound semiconductor layer in the semiconductor region 5 is, for example, a III nitride semiconductor layer, such as a GaN semiconductor, an InGaN semiconductor, an InGaAlN semiconductor layer, or AlN. The group III nitride semiconductor layer in the active region 7 is made, for example, of an InGaN semiconductor.

With reference to area (B) in FIG. 14, a nitride semiconductor device 1a comprises a III nitride substrate 3, a semiconductor region 5, and a quantum well region 9. The quantum well region 9 includes well layers 9a and barrier layers 9b. The well layers 9a are made of a first $In_{X1}Al_{Y1}Ga_{1-Y1-X1}N$ semiconductor ($0<X1<1$, $0\leq Y1<1$, $0<X1+Y1<1$), and the barrier layers 9b are made of a second $In_{X2}Al_{Y2}Ga_{1-Y2-X2}N$ semiconductor ($0<X2\leq 1$, $0<Y2<1$, $0<X2+Y2<1$). As shown in area (B) in FIG. 14, the barrier layers 9b provide potential barrier against the well layers 9a. The quantum well region 9 is located between the group III nitride substrate 3 and the semiconductor region 5. The semiconductor region 5 can include a first semiconductor layer 5a made of a compound of at least one of indium, gallium, and aluminum, and nitrogen.

Since in this group III nitride semiconductor device the p-type dopant in the group III nitride semiconductor region can be activated by use of multiphoton absorption, without use of a heating furnace, the quantum well structure 9 is provided without thermal deterioration.

The nitride semiconductor device 1a can be a semiconductor light generating device, such as a light-emitting diode or a laser diode, and, for example, the light-emitting diode is composed of the following layers:

group III nitride substrate 3: n-type GaN substrate;
group III nitride semiconductor layer 15: Si-doped n-type GaN semiconductor, 2 μm;
first cladding layer 11: undoped $In_{0.01}Ga_{0.99}N$ semiconductor, 15 nm;
quantum well structure 9: 5 cycles,
well layers 9a: undoped $In_{0.15}Ga_{0.85}N$ semiconductor, 1.6 nm,
barrier layers 9b: undoped $In_{0.01}Ga_{0.99}N$ semiconductor, 15 nm;
second cladding layer 13: undoped $In_{0.01}Ga_{0.99}N$ semiconductor, 15 nm;
group III nitride semiconductor layer 5: Mg-doped p-type AlGaN semiconductor, 20 nm (where Mg is activated by irradiation with a short pulsed laser beam);
contact layer 17: Mg-doped p-type $In_{0.00}Ga_{0.99}N$ semiconductor, 50 nm (where Mg is activated by irradiation with a short pulsed laser beam);
electrode (anode): Ni/Au;
electrode (cathode): Ti/Al.

As described above, the present embodiment provides the group III nitride semiconductor device including the p-type group III nitride semiconductor region activated by use of the multiphoton absorption, without any heating activation of the p-type dopant in the group III nitride semiconductor region.

Fourth Embodiment

Area (A), area (B), and area (C) in FIG. 15 are drawings showing steps in a method of forming a nitride semiconductor device according to the fourth embodiment. Area (A), area (B), and area (C) in FIG. 16 are drawings showing steps in the method of forming the nitride semiconductor device according to the present embodiment.

A group III compound electroconductive substrate is prepared. The group III compound electroconductive substrate can be, for example, a GaN substrate 31, as shown in area (A) in FIG. 15. The GaN substrate 31 is subjected to a pretreatment using ammonia ($NH_3$). The temperature of this pretreatment can be, for example, 100 degrees centigrade. Next, a gallium nitride (GaN) film 33 is formed on the GaN substrate 31. The gallium nitride (GaN) film 33 has, for example, the n-type conductivity. The GaN film 33 is grown, for example, using a metal organic vapor phase epitaxy apparatus. The film formation temperature is, for example, 1150 degrees centigrade. The film thickness is, for example, about 2 μm.

Next, as shown in area (B) in FIG. 15, a first cladding film 35 is formed on the GaN film 33. The first cladding film 35 can be, for example, an $In_{0.01}Ga_{0.99}N$ semiconductor film and this InGaN semiconductor film can be an undoped one. The film formation temperature thereof can be, for example, 800 degrees centigrade. The film thickness thereof is, for example, 15 nm.

Thereafter, an active region 37 including a group III nitride semiconductor layer is formed on the group III compound electroconductive substrate. The active region 37 includes a nitride semiconductor layer containing indium and gallium, and can include, for example, an InGaN semiconductor layer. In a preferred example, as shown in area (C) in FIG. 15, the active region 37 can have a quantum well structure. This active region 37 can include well films 39 and barrier films 41. Each of the well films 39 and barrier films 41 can be an InGaN semiconductor film. The well films 39 can be, for example, undoped $In_{0.15}Ga_{0.85}N$ semiconductor films, and the barrier films 41 can be, for example, undoped $In_{0.01}Ga_{0.99}N$ semiconductor films. In this quantum well structure, these well films 39 and barrier films 41 are alternately repeatedly formed in five cycles. The film formation temperature of the well films 39 and barrier films 41 can be, for example, 800 degrees centigrade.

Next, as shown in area (A) in FIG. 16, a second cladding film 43 is formed on the active region 37. The second cladding film 43 can be, for example, an $In_{0.01}Ga_{0.99}N$ semiconductor film, and this InGaN semiconductor film can be an undoped one. The film formation temperature thereof can be, for example, 800 degrees centigrade. The film thickness thereof is, for example, 15 nm.

Thereafter, as shown in area (B) in FIG. 16, a third cladding film is formed on the second cladding film 43. The third cladding film contains a p-type dopant, such as Mg. The third cladding film is a group III-V compound semiconductor film 45. The group III-V compound semiconductor film 45 can be made, for example, of a compound of at least either of gallium and aluminum, and nitrogen. The film formation temperature of the third cladding film is, for example, about 1100 degrees centigrade. The film thickness of the third cladding film can be, for example, 20 nm.

Thereafter, as shown in area (C) in FIG. 16, a contact film 47 is formed on the third cladding film. The contact film 47 is a group III-V compound semiconductor. The semiconductor of the contact film 47 has a bandgap smaller than that of the semiconductor of the third cladding film and can be made, for example, of a GaN semiconductor containing the magnesium dopant. The semiconductor of the contact film 47 can be formed at a temperature of about 1100 degrees centigrade.

After the group III nitride semiconductor regions 45, 47 doped with the p-type dopant are formed, the group III nitride semiconductor regions 45, 47 are irradiated with a short pulsed laser beam 53 by means of a short pulsed laser light emitter 51. This irradiation results in causing desorption of hydrogen 55 from the group III nitride semiconductor regions 45, 47 and forming the activated p-type dopant 57 in the group III nitride semiconductor regions 45, 47. The p-type dopant in the group III nitride semiconductor regions 45, 47 can be activated without use of a heating furnace.

As described previously, for example, the femtosecond laser pulse is faster than the relaxation time of lattice vibration, and the femtosecond laser completes decoupling in the atomic level by irradiation per pulse. Thus, it can minimize the increase of temperature due to phonon coupling. The short pulsed light source is also effective to desorption of hydrogen atoms.

The temperature is not increased by heat or infrared light or the like in order to implement dissociation of hydrogen from the p-type dopant of magnesium. This provides the method of forming the p-type group III nitride semiconductor region.

The short pulsed light source in this method is as described above. Thereafter, an electrode film for an anode electrode is formed on the contact film 47. An electrode film for a cathode electrode is formed on a back surface 31 of the substrate. The irradiation with the short pulsed laser can also be performed after formation of the electrodes.

As described above, the present embodiment provides the method of forming the p-type group III nitride semiconductor region by use of multiphoton absorption without the heating activation of the p-type dopant in the group III nitride semiconductor region.

EXAMPLE 1

In a preferred example, a semi-insulating GaN substrate is set on a susceptor, and a p-type semiconductor layer is fabricated by the MOVPE method as described below. The source materials used are trimethyl gallium, ammonia, and bisethyl cyclo-pentadienyl magnesium. First, hydrogen ($H_2$) and ammonia ($NH_3$) are introduced at the temperature of 1100° C. to effect cleaning. A GaN layer is grown to 2 μm at the growth temperature of 1150° C., and thereafter a Mg-doped GaN film is grown to the thickness of 50 nm at the growth temperature of 1100° C.

The p-type semiconductor layer grown in this manner is set in the short pulsed laser emitter and the sample is irradiated with a femtosecond laser beam having the spatial output of 0.4-3.8 Watts to decrease the resistance. The Mg-doped GaN film demonstrates the p-type conductivity as a result of hole measurement.

EXAMPLE 2

In another example, a sapphire substrate is placed on a susceptor, and a p-type semiconductor layer is fabricated by the MOVPE method as described below. The source materials used are trimethyl gallium, ammonia, and bisethyl cyclo-pentadienyl magnesium. First, hydrogen gas ($H_2$) is introduced at the temperature of 1100° C. to effect cleaning, thereafter a low-temperature buffer layer is grown to 25 nm at the growth temperature of 475° C., and a GaN layer is grown to 2 μm at the growth temperature of 1160° C. Thereafter, a Mg-doped GaN layer is grown to the thickness of 500 nm at the growth temperature of 1110° C.

The p-type semiconductor layer grown in this manner is set in the short pulsed laser light emitter 51, and the sample is irradiated with the femtosecond laser beam having the spatial output of 0.4-3.8 Watts to decrease the resistance. The Mg-doped GaN layer demonstrates the p-type conductivity as a result of hole measurement.

EXAMPLE 3

In still another example, an n-conductivity GaN substrate is set on a susceptor, and a blue-emitting diode structure is fabricated by the MOVPE method as described below. The source materials used are trimethyl gallium, trimethyl aluminum, trimethyl indium, ammonia, silane, and bisethyl cyclo-pentadienyl magnesium. An n-type GaN layer is grown to 2 μm at the growth temperature of 1100° C., and thereafter the temperature is decreased to 800° C., at which a 5-MQW active layer is grown in a structure consisting of $In_{0.16}Ga_{0.84}N$ well layers in the thickness of 1.6 nm and $In_{0.01}Ga_{0.99}N$ barrier layers in the thickness of 15 nm. Then the temperature is increased to 1100° C. At this temperature, a Mg-doped $Al_{0.12}Ga_{0.88}N$ layer is grown to 20 nm and a p-type contact GaN film is further grown to 50 nm.

The LED epitaxial structure grown in this manner is set in the short pulsed light emitter and the sample is irradiated with the femtosecond laser beam having the spatial output of 0.4-3.8 Watts to decrease the resistance. A semitransparent anode electrode is formed on the p-type GaN layer, and a cathode electrode is formed on the opposite side to the epitaxial layer on the GaN substrate, thereby fabricating a blue-emitting diode. When an electric current was continuously applied to this light-emitting diode, a higher optical output was obtained therefrom than from a sample which was obtained from the same wafer and the resistance of which was decreased by thermal annealing without use of the short pulsed laser light. XRD measurement was conducted before and after the decrease of resistance, and showed higher-order satellites in the sample activated with the short pulsed laser beam, as compared with a sample whose dopant was activated by another method. It is understood from this result that the resistance was decreased without degradation of crystallinity.

The principle of the present invention has been described and illustrated the embodiments of the preferred embodiments, it is appreciated by those having skill in the art that the invention can be modified in arrangement and detail without departing from such principles. The present invention is not limited to the specific embodiments in the specification.

Details of structures of these devices can be modified as necessary. For example, the semiconductor light-emitting elements were described as the semiconductor devices, but the semiconductor devices are not limited thereto. The embodiments described the methods of activating the dopant in part or in the whole of the GaN semiconductor region to form the p-type GaN semiconductor region, but the dopant activation methods are not limited to the activation of the GaN semiconductors and are also applicable to any semiconductor made of at least one of a group III-V semiconductor, a group II-VI semiconductor, and a group IV semiconductor. We therefore claim all modifications and variations coming within the spirit and scope of the following claims.

What is claimed is:

1. A method of forming a p-type semiconductor region by activating a p-type dopant in a semiconductor, the method comprising the step of:
    applying a laser beam to a semiconductor region containing hydrogen and a p-type dopant to activate the p-type dopant by causing a multi-photon absorption process, the semiconductor region being made of one of a group III-V semiconductor or a group II-VI semiconductor,
    wherein a wavelength of the laser beam is longer than a wavelength corresponding to a bandgap energy of material of the semiconductor region.

2. The method according to claim 1,
    wherein the semiconductor region is a gallium nitride compound semiconductor region, and
    wherein the p-type dopant is at least either one of magnesium and zinc.

3. The method according to claim 1,
    wherein the laser beam is a pulsed laser beam having a pulse width of not more than 100 nanoseconds.

4. The method according to claim 1,
    wherein the laser beam is a pulsed laser beam having a pulse width of not more than 10000 femtoseconds.

5. The method according to claim 1,
    wherein, in the step of activating the p-type dopant, at least either one of an electric field and a magnetic field is applied to the semiconductor region.

6. The method according to claim 1,
    wherein an intensity of the laser beam is not less than $10^4$ W/cm$^2$.

7. The method according to claim 1,
    wherein activating the p-type dopant comprises performing direct writing with the laser beam to pattern an activated region in the semiconductor region.

8. The method according to claim 1, further comprising growing the semiconductor region while supplying p-type dopant gas.

9. The method according to claim 7, wherein the p-type dopant is at least magnesium or zinc, and the semiconductor region is made of a gallium nitride based compound semiconductor.

10. The method according to claim 7, wherein the semiconductor region is grown by MOVPE.

* * * * *